United States Patent
Moore, Jr. et al.

(10) Patent No.: US 9,946,328 B2
(45) Date of Patent: Apr. 17, 2018

(54) AUTOMATED SYSTEM FOR COLD STORAGE SYSTEM

(71) Applicant: International Business Machines Corporation, Armonk, NY (US)

(72) Inventors: John E. Moore, Jr., Brownsburg, IN (US); Jeffrey K. Price, Austin, TX (US); Robert R. Wentworth, Round Rock, TX (US); Stanley C. Wood, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/926,221

(22) Filed: Oct. 29, 2015

(65) Prior Publication Data
US 2017/0123480 A1  May 4, 2017

(51) Int. Cl.
*G06F 1/00* (2006.01)
*G06F 1/32* (2006.01)
*G06F 1/20* (2006.01)
*H05K 7/20* (2006.01)

(52) U.S. Cl.
CPC ............ *G06F 1/3268* (2013.01); *G06F 1/206* (2013.01); *G06F 1/3221* (2013.01); *H05K 7/20836* (2013.01)

(58) Field of Classification Search
CPC ........ G06F 15/177; G05B 21/00; G05B 21/02
USPC ....................................................... 713/323
See application file for complete search history.

(56) References Cited

U.S. PATENT DOCUMENTS

| 7,788,941 | B2 | 9/2010 | Campbell et al. |
| 9,104,387 | B1* | 8/2015 | Eichelberg ............... G06F 1/20 |
| 9,158,734 | B1* | 10/2015 | Prabhakara ......... H04L 67/1097 |
| 9,392,720 | B1* | 7/2016 | Kim ..................... H05K 7/1485 |
| 2005/0138440 | A1* | 6/2005 | Barr ....................... G06F 1/206 713/300 |
| 2007/0174024 | A1* | 7/2007 | Rasmussen ....... H05K 7/20836 703/1 |
| 2008/0218949 | A1 | 9/2008 | Hughes |
| 2008/0265722 | A1* | 10/2008 | Saliaris .................. G06F 1/181 312/223.1 |

(Continued)

FOREIGN PATENT DOCUMENTS

JP    2014190624 A    10/2014
WO    2007054578 A1    5/2007

OTHER PUBLICATIONS

Shrivastava et al., "Quantitative Comparison of Air Containment Systems", 2012 13th IEEE Intersociety Conference on Thermal and Thermomechanical Phenomena in Electronic Systems (ITherm), © 2012 IEEE, 10 pages.

(Continued)

*Primary Examiner* — Vincent Tran
(74) *Attorney, Agent, or Firm* — Edward J. Wixted, III

(57) ABSTRACT

In an approach to managing racks in a MAID system, a first rack of a data center is identified. The data center comprises a plurality of racks. The first rack corresponds to a request. The request is one of (i) a request to change a power status of a storage device of the first rack or (ii) a request to service the first rack. An optimal placement of the plurality of racks is calculated to satisfy a condition of the request. One or more of the racks are moved from a first location to a second location, based on the calculated optimal placement of the one or more racks.

17 Claims, 5 Drawing Sheets

(56) References Cited

U.S. PATENT DOCUMENTS

| | | | |
|---|---|---|---|
| 2008/0269932 A1* | 10/2008 | Chardon | G06T 11/206 700/98 |
| 2009/0150123 A1* | 6/2009 | Archibald | G06F 17/5004 703/1 |
| 2009/0309570 A1* | 12/2009 | Lehmann | G06F 1/26 323/318 |
| 2011/0077795 A1* | 3/2011 | VanGilder | G06F 1/206 700/300 |
| 2011/0078290 A1* | 3/2011 | Calo | G06F 9/5094 709/221 |
| 2012/0119632 A1* | 5/2012 | Bousseton | H05K 7/20745 312/236 |
| 2013/0073258 A1* | 3/2013 | VanGilder | G06F 15/00 702/182 |
| 2013/0171006 A1 | 7/2013 | Ma et al. | |
| 2014/0014292 A1* | 1/2014 | Rice | H05K 7/20745 165/11.1 |
| 2014/0029196 A1 | 1/2014 | Smith | |
| 2015/0083363 A1 | 3/2015 | Lindenstruth et al. | |
| 2016/0003894 A1* | 1/2016 | Maulsby | G01R 31/2877 324/750.03 |
| 2016/0275351 A1* | 9/2016 | Cattoen | G06K 9/6202 |
| 2017/0086325 A1* | 3/2017 | Connor | H05K 7/1489 |

OTHER PUBLICATIONS

Udakeri et al., "Comparison of Overhead Supply and Underfloor Supply with Rear Heat Exchanger in High Density Data Center Clusters", © 2008 IEEE, Twenty-fourth Annual IEEE Semiconductor Thermal Measurement and Management Symposium, 2008, 8 pages, DOI: 10.1109/STHERM.2008.4509385.

"A method to effectively cool temporal data providing maximal ROI", An IP.com Prior Art Database Technical Disclosure, Authors et. al.: Disclosed Anonymously, IP.com No. 000205227, IP.com Electronic Publication: Mar. 21, 2011, pp. 1-4.

"Proactive data center cooling using multiple coolants for auto regulating mechanism over potential hot spots in storage/servers systems", An IP.com Prior Art Database Technical Disclosure, Authors et. al.: Disclosed Anonymously, IP.com No. 000226586, IP.com Electronic Publication: Apr. 17, 2013, pp. 1-5.

* cited by examiner

AUTOMATED SYSTEM FOR COLD STORAGE SYSTEM

BACKGROUND OF THE INVENTION

The present invention relates generally to the field of cold storage systems, and more particularly to increasing density of Massive Array of Idle Disk (MAID) systems.

Cold storage systems often utilize MAID systems with multiple (e.g., hundreds to thousands) hard drives, most of which are powered down at any given time, to provide nearline storage of data. In some examples, MAID systems are used in "write once, read occasionally" applications, where increased storage density and decreased cost are traded for increased retrieval latency and decreased redundancy. Often, MAID systems are used to store cold data that is infrequently accessed. In some cases, cold data is kept for regulatory or historical reasons. In MAID applications, the increased latency, caused by waiting for an idle drive to power up, is traded for the increased density and lower power consumption of keeping most drives in an idle (i.e., unpowered) state. For example, when a hard drive is not actively being accessed, the storage device can be shut down. Once a drive is shut down it is not consuming power or generating heat, allowing the drive to begin to cool down.

SUMMARY

According to one embodiment of the present invention, a method for managing racks of an increased density MAID system is provided. The method includes identifying, by one or more processors, a first rack in a data center corresponding to a request, wherein the data center comprises a plurality of racks, and wherein the request is one of: a request to change a power status of a storage device of the first rack; or a request to service the first rack; calculating, by one or more processors, an optimal placement for the plurality of racks to satisfy a condition of the request; and moving, by one or more processors, one or more racks from a first location to a second location, based on the calculated optimal placement of the one or more racks.

According to another embodiment of the present invention, a computer program product for managing racks of an increased density MAID system is provided. The computer program product comprises a computer readable storage medium and program instructions stored on the computer readable storage medium. The program instructions include program instructions to program instructions to identify a first rack in a data center corresponding to a request, wherein the data center comprises a plurality of racks, and wherein the request is one of: a request to change a power status of a storage device of the first rack; or a request to service the first rack; program instructions to calculate an optimal placement for the plurality of racks to satisfy a condition of the request; and program instructions to move one or more racks from a first location to a second location, based on the calculated optimal placement of the one or more racks.

According to another embodiment of the present invention, a computer system for managing racks of an increased density MAID system is provided. The computer system includes one or more computer processors, one or more computer readable storage media, and program instructions stored on the computer readable storage media for execution by at least one of the one or more processors, the program instructions comprising: program instructions to program instructions to identify a first rack in a data center corresponding to a request, wherein the data center comprises a plurality of racks, and wherein the request is one of: a request to change a power status of a storage device of the first rack; or a request to service the first rack; program instructions to calculate an optimal placement for the plurality of racks to satisfy a condition of the request; and program instructions to move one or more racks from a first location to a second location, based on the calculated optimal placement of the one or more racks.

DETAILED DESCRIPTION

An embodiment of the present invention recognizes a benefit in increasing density of MAID systems. Commonly, MAID systems are cooled by a combination of air flow around the storage device and powering down the storage devices, when not in use. In some instances, increasing the density of the MAID system (i.e., increasing the number of storage devices in a given physical space) can impede the air flow in the system, limiting the cooling potential within the system.

An embodiment of the present invention provides automated creation of plenum spaces for cooling and maintenance of MAID systems. In some embodiments, the automated creation of plenum spaces can accommodate an increased storage device density while sustaining cooling requirements for the system. In other embodiments, the creation of service lanes is used to provide access to hard drive stacks within the MAID system. For example, service lanes can be used to provide access to racks that require maintenance.

Figure 1:
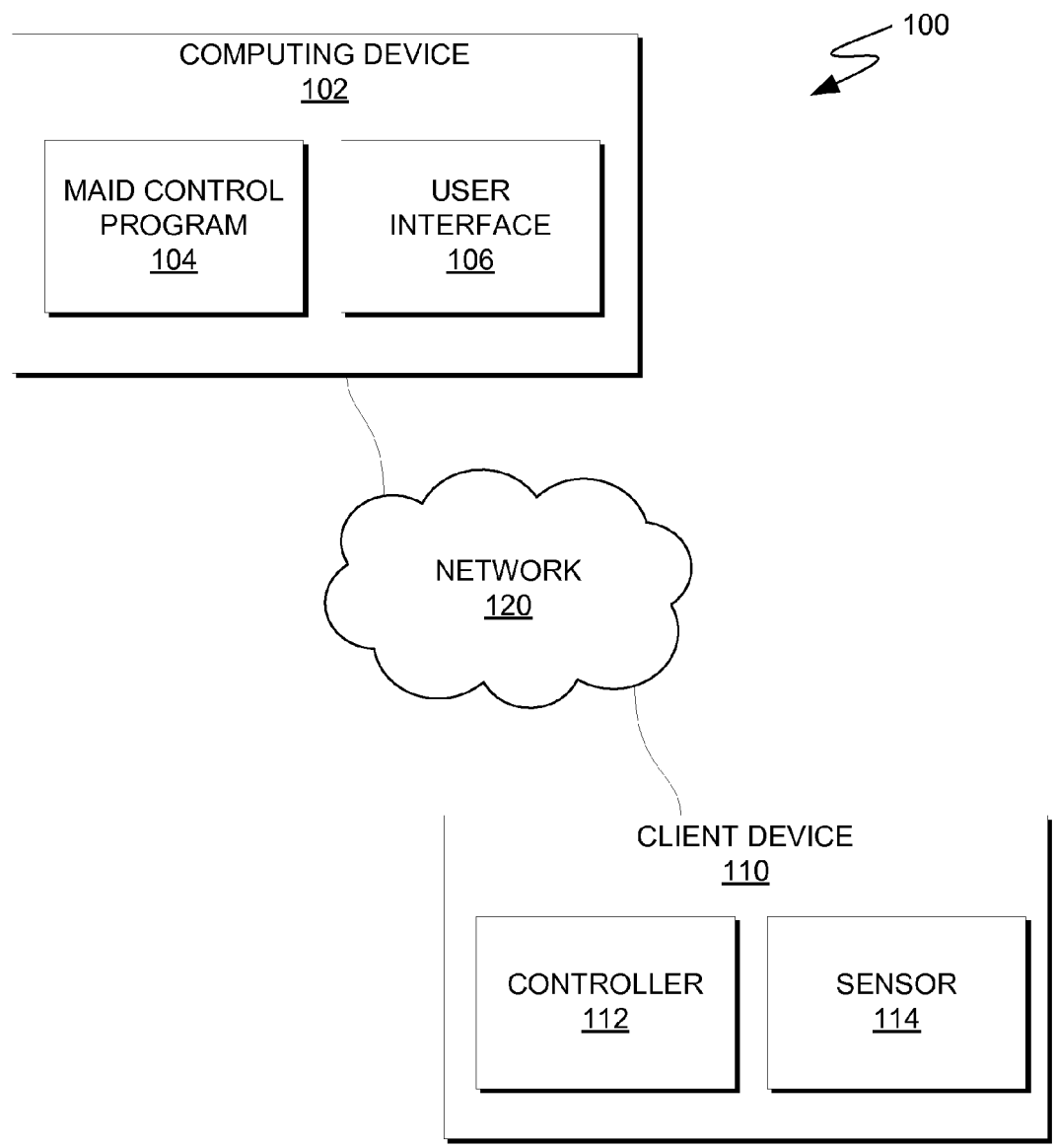
FIG. 1 is a functional block diagram illustrating a computing environment, in accordance with an embodiment of the present invention.

The present invention will now be described in detail with reference to the Figures. FIG. 1 is a functional block diagram illustrating a computing environment, in accordance with an embodiment of the present invention. For example, FIG. 1 is a functional block diagram illustrating computing environment 100. Computing environment 100 includes computing device 102 and client device 110 connected over network 120. Computing device 102 includes MAID control program 104.

In various embodiments, computing device 102 is a computing device that can be a standalone device, a server, a laptop computer, a tablet computer, a netbook computer, a personal computer (PC), or a desktop computer. In another embodiment, computing device 102 represents a computing system utilizing clustered computers and components to act as a single pool of seamless resources. In general, computing device 102 can be any computing device or a combination of devices with access to client device 110, and with access to and/or capable of executing MAID control program 104. Computing device 102 may include internal and external hardware components, as depicted and described in further detail with respect to FIG. 5.

In this exemplary embodiment, MAID control program 104 is stored on computing device 102. In other embodiments, MAID control program 104 may reside on another computing device, provided that it can access and is accessible by each of user interface 106, controller 112, and sensor 114. In yet other embodiments, MAID control program 104 may be stored externally and accessed through a communication network, such as network 120. Network 120 can be, for example, a local area network (LAN), a wide area network (WAN) such as the Internet, or a combination of the two, and may include wired, wireless, fiber optic or any other connection known in the art. In general, network 120 can be any combination of connections and protocols that will support communications between computing device 102 and client device 110, in accordance with a desired embodiment of the present invention.

MAID control program 104 operates to determine the position of racks, which house one or more storages devices, within a MAID system. In one embodiment, MAID control program 104 positions racks to define one or more plenum spaces. In some embodiments, the plenum spaces are used to increase the cooling of drives within a MAID system. In other embodiments, MAID control program 104 positions racks to define one or more service lanes. In some embodiments, service lanes allow for physical access to one or more racks for system maintenance. For example, one or more racks can be moved to create an access lane to replace or repair a drive within the MAID system.

Computing device 102 includes a user interface (UI) 106, which executes locally on computing device 102 and operates to provide a UI to a user of computing device 102. User interface 106 further operates to receive user input from a user via the provided user interface, thereby enabling the user to interact with computing device 102. In one embodiment, user interface 106 provides a user interface that enables a user of computing device 102 to interact with MAID control program 104 of computing device 102 via network 120. In various examples, the user interacts with MAID control program 104 in order to initiate movement of racks to create plenum spaces within a MAID system. In one embodiment, user interface 106 is stored on computing device 102. In other embodiments, user interface 106 is stored on another computing device (e.g., client device 110), provided that user interface 106 can access and is accessible by at least MAID control program 104.

In various embodiments of the present invention, client device 110 can be a laptop computer, a tablet computer, a netbook computer, a personal computer (PC), a desktop computer, a personal digital assistant (PDA), a smart phone, or any programmable electronic device capable of communicating with computing device 102 via network 120. Client device 110 includes controller 112 and sensor 114. In some embodiments, controller 112 and sensor 114 execute locally on client device 110. In other embodiments, controller 112 and sensor 114 execute on another computing device (e.g., computing device 102), provided that each can access and is accessible by at least MAID control program 104.

Controller 112 receives instructions from MAID control program 104 to move racks within the MAID system. In some embodiments, controller 112 uses MAID control program 104 instructions to move racks one dimensionally. In other embodiments, controller 112 uses MAID control program 104 instructions to move racks in two dimensions.

Sensor 114 monitors the MAID system and provides data to MAID control program 104. In some embodiments, sensor 114 monitors the temperature of the MAID system. For example, sensor 114 can be one or more of thermometers placed throughout the MAID system. When one of the thermometers reads a temperature above a predetermined threshold, MAID control program 104 determines that one or more racks need to move to allow a hot rack to cool. For example, the hot rack may be identified based on the proximity of the hot rack to a thermometer reading a temperature above a threshold.

Figure 2:
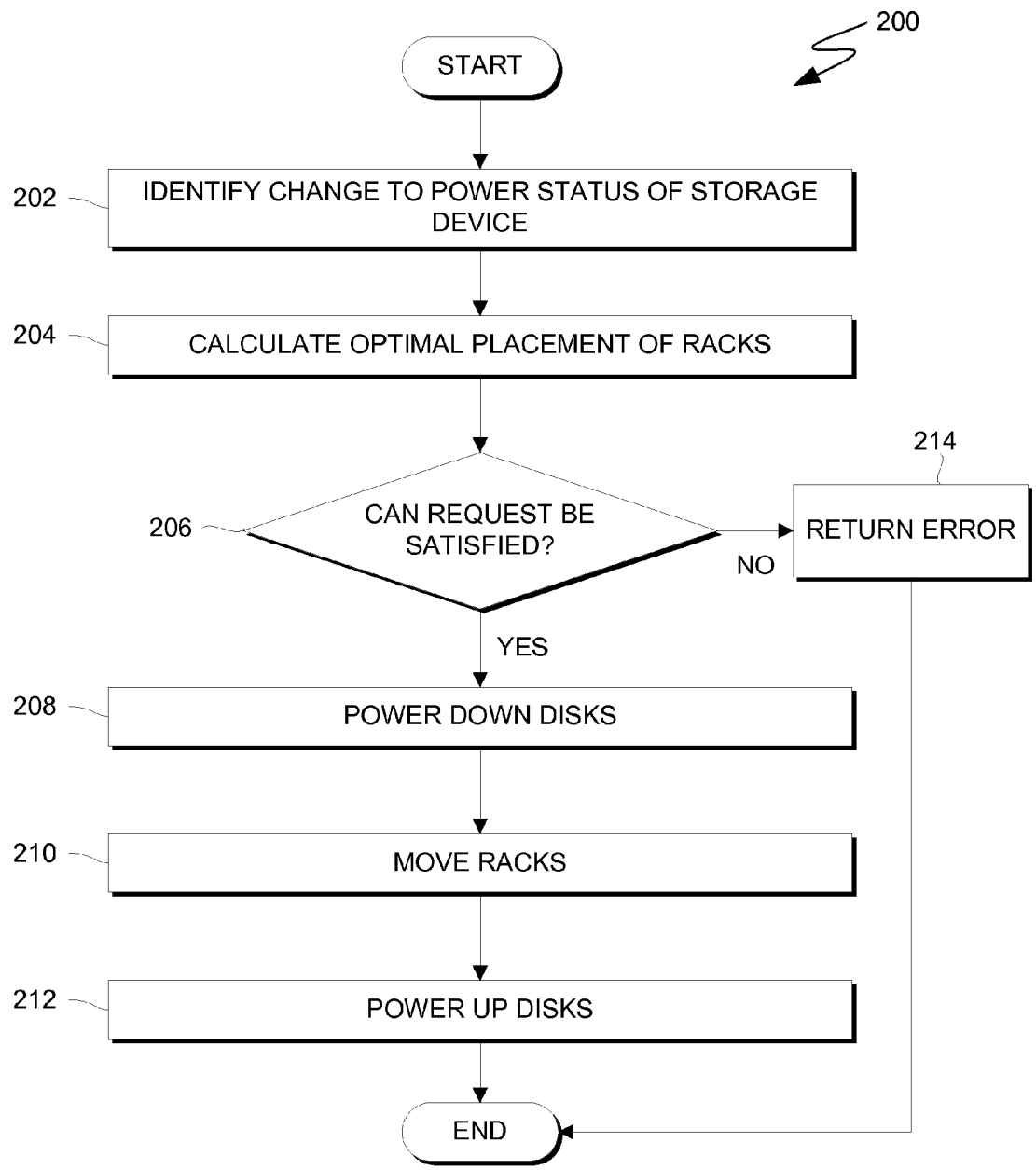
FIG. 2 is a flowchart depicting operations for creating plenum spaces for cooling racks in a MAID system, on a computing device within the computing environment of FIG. 1, in accordance with an embodiment of the present invention.

FIG. 2 is a flowchart depicting operations for creating plenum spaces within a MAID system for cooling MAID racks, on a computing device within the computing environment of FIG. 1, in accordance with an embodiment of the present invention. For example, FIG. 2 is a flowchart depicting operations 200 of MAID control program 104, on computing device 102 within computing environment 100.

In step 202, MAID control program 104 identifies a change to the power status of a storage device in the MAID system. In some embodiments, the identification is a result of a user attempt to access information stored on a storage device. In these embodiments, where the information is stored on a storage device that was not already powered up (e.g., due to inactivity), the storage device needs to be powered up to allow access to information stored on the storage device. In other embodiments, the identification is a result of the termination of access to a storage device. For example, when access to information on a storage device is no longer needed, the storage device can be powered down to save energy. In some embodiments, the identification is a result of an interaction with user interface 106. For example, an operator of the MAID system indicates that a storage device needs to be powered up or powered down via user interface 106. In still other embodiments, the identification is a result of a reading from sensor 114. For example, a thermometer in the proximity of a hot rack reads a temperature above a threshold. Storage devices, housed in racks, within the MAID system have cooling requirements, which are satisfied, in some embodiments, by increasing the space between racks. In some embodiments, increasing the space between racks allows for greater air flow.

In step 204, MAID control program 104 calculates the optimal placement of racks within the MAID system. In some embodiments, the optimal placement of racks is based on cooling requirements of a storage device. In these embodiments, MAID control program 104 determines the optimal placement of one or more racks based on cooling conditions. In some embodiments, optimal placement is based on industry or device standards. In other embodiments, optimal placement is based on a desired air flow. For example, MAID control program 104 determines a desired air flow for a storage device (e.g., based on the temperature of the storage device) and determines a placement of the rack based on the air flow from an air vent and the space between adjacent racks. In still other embodiments, optimal air flow is based, at least in part, on the temperatures of adjacent storage devices. In some embodiments, a cooling condition includes an air flow required to cool a storage device. In other embodiments, the cooling condition includes a requirement for amount of plenum space surrounding a rack. In some embodiments, a finite amount of space exists to accommodate space between racks. In these embodiments, MAID control program 104 may have to prioritize the cooling of one or more storage device. In some embodiments, the racks of the MAID system are arranged in a grid pattern. For example, the racks are arranged in columns and rows. In some embodiments, the racks move in one dimension. For example, a rack can move from one column to another, but stays within the same row. In some examples, rack movement is in whole integers, being multiples of the width of a rack. For example, a rack moves from one column to another column (i.e., the rack cannot reside between columns), to maintain the grid pattern. In other embodiments, rack movement can be in partial integers, being fractions of the width of a rack (e.g., racks can be placed between columns in the grid pattern), to accommodate the cooling of storage devices in multiple racks in a row at once.

In some examples, storage devices housed in more than one rack in the MAID system need to be cooled simultaneously. In these examples, MAID control program 104 may need to prioritize the cooling of one rack of storage devices over another, where space limitations prevent the racks from being fully isolated. For example, priority of cooling one rack of storage devices over another may be based on length of time each storage device has been powered up (e.g., the longer a storage device is powered up the greater the need for cooling), the temperature readings surrounding each rack (e.g., racks with a higher temperature may be given priority), temperature readings or power status of storage devices in surrounding racks (e.g., multiple hot racks in close proximity can impede rack cooling), etc. In some embodiments, priority of cooling one rack of storage devices over another is based on the cooling conditions for each storage device. In some embodiments, the optimal placement of a rack will provide plenum spaces on two or more sides of the rack. In other embodiments, the optimal placement will provide a single plenum space between two hot racks. In some embodiments, MAID control program 104 uses information from sensor 114 to determine rack placement. For example, where sensor 114 is one or more of thermometers, MAID control program 104 bases the optimal placement on the temperature readings from the thermometer(s).

In decision 206, MAID control program 104 determines whether the optimal placement can be satisfied. In some example, MAID control program 104 may not be able to move each of the racks to the calculated optimal placement. For example, where there is a mechanical failure within the MAID system, some of the racks may not be able to move. In another example, some racks cannot move when storage devices housed within are in use. In this example, the storage devices within the racks must be powered down before the rack can be moved. If MAID control program 104 determines that the optimal placement can be satisfied (decision 206, YES branch), then MAID control program 104 calculates the number of moves required for the optimal placement (e.g., the number of racks that need to be moved for the optimal placement). If MAID control program 104 determines that the optimal placement cannot be satisfied (decision 206, NO branch), then MAID control program 104 returns an error. In some embodiments, in response to returning an error, MAID control program 104 returns to step 204 to calculate a new placement plan for the racks.

In step 208, MAID control program 104 powers down storage devices in the racks. In some embodiments, MAID control program 104 prevents moving racks with a storage device that is powered up (e.g., in order to reduce the risk of damage to the storage device). In this case, MAID control program 104 powers down a storage device to be moved by issuing commands to the powered up storage devices. In some embodiments, the command to power down is issued directly to the storage device. In other embodiments, the command to power down the storage device is issued to a server or computing device that controls the power settings of the storage device. In some embodiments, the storage devices in the racks that need to be moved are already powered down. In still other embodiments, the racks can be moved while the storage devices are powered up. In embodiments where the storage devices do not need to be powered down to move, MAID control program 104 skips step 208.

In step 210, MAID control program 104 moves racks. MAID control program 104 sends directions to controller 112 to move one or more racks within the MAID system. In some embodiments, the racks are on wheels which move one-dimensionally along a track.

In some embodiments, moving racks includes modifying air flow through vents placed throughout the MAID system. In some embodiments, the air flow is increased or decreased. In other embodiments, the direction of the air flow is modified. For example, baffles within the air vents can be moved to change the direction of the air flow. Modifying the air flow through the vents allows the air to be directed towards racks with storage devices requiring the most cooling.

In step 212, MAID control program 104 powers up storage devices in the racks. Racks containing storage devices with information requested by a user are powered up. In embodiments where storage devices have to be powered down before they are moved, the storage devices are powered on after they are moved to the optimal placement. Powering up storage devices allows users to access information stored on storage devices in the racks. In some embodiments, where the request is to power down a storage device, there is not a need to restore power to the storage device after the racks have been moved. In these embodiments, MAID control program 104 skips step 212.

In step 214, MAID control program 104 returns an error message. Where MAID control program 104 cannot move racks to satisfy the optimal placement, MAID control program 104 delivers an error message to the user via user interface 106. In some embodiments, the optimal placement cannot be satisfied because a storage device in the rack is in use and cannot be powered down. In other embodiments, the optimal placement cannot be satisfied due to a mechanical failure within the MAID system. In still other embodiments, the optimal placement cannot be satisfied due to emergent cooling needs elsewhere in the MAID system. In some embodiments, the error message includes a description as to why the optimal placement cannot be satisfied. In some embodiments, MAID control program 104 powers down one or more storage devices to avoid overheating, where optimal placement cannot be achieved.

Figure 3:
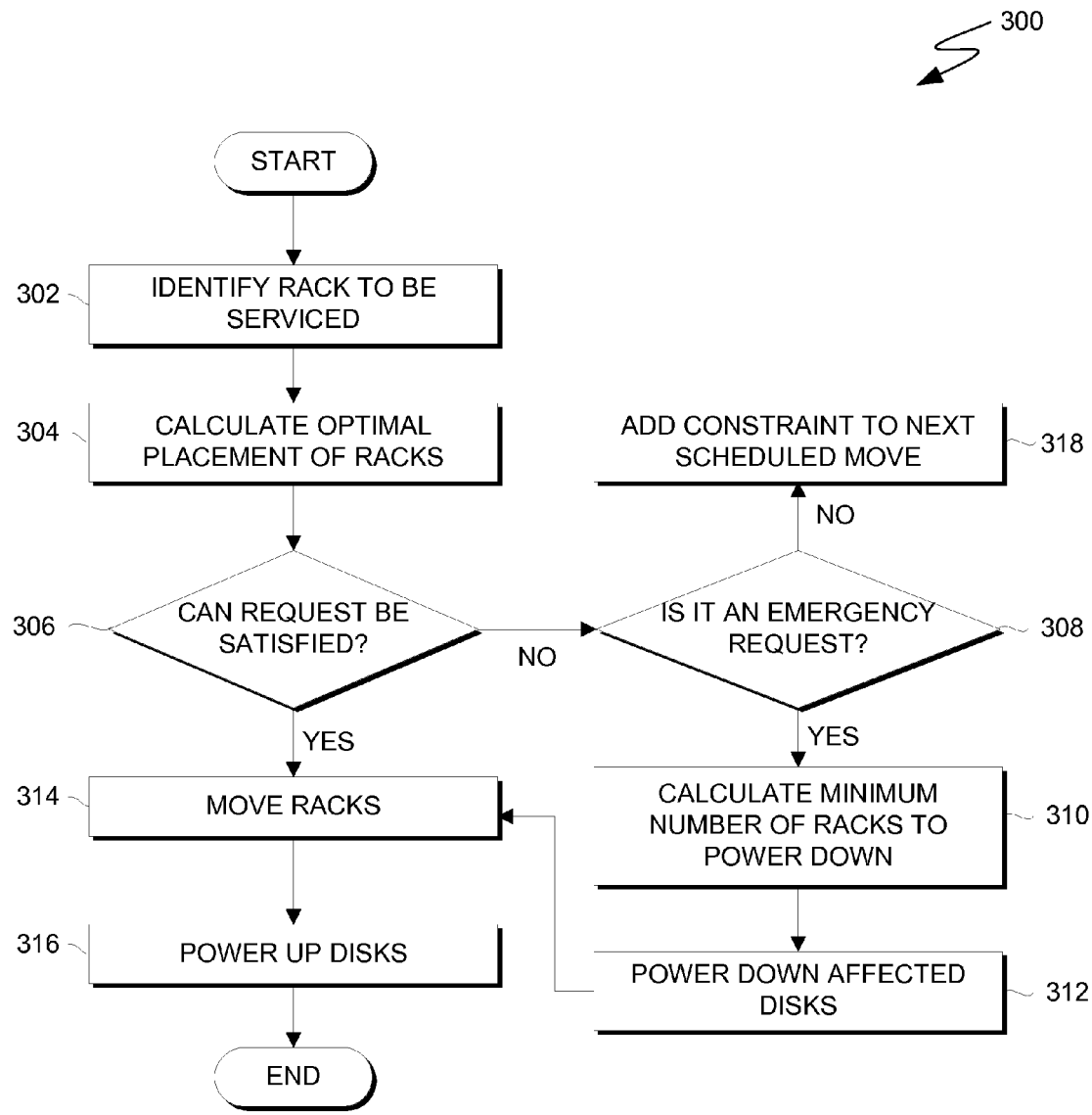
FIG. 3 is a flowchart depicting operations for creating plenum spaces for maintenance of racks in a MAID system, on a computing device within the computing environment of FIG. 1, in accordance with an embodiment of the present invention.

FIG. 3 is a flowchart depicting operations for creating plenum spaces within a MAID system for maintenance, on a computing device within the computing environment of FIG. 1, in accordance with an embodiment of the present invention. For example, FIG. 3 is a flowchart depicting operations 300 of MAID control program 104, on computing device 102 within computing environment 100.

In step 302, MAID control program 104 identifies a rack to be serviced. In some embodiments, the identification is based on a request to service a storage device located within a rack in the MAID system. In some embodiments, the identification is based on the receipt of an error message during operations 200. For example, a request can be part of routine maintenance. In another example, a request can be made in response to an error message (e.g., in response to step 214 of operations 200). In other embodiments, the request is received in response to a user interaction with user interface 106. For example, a user indicates that a rack needs to be serviced by selecting the rack on a graphical user interface.

In step 304, MAID control program 104 calculates the optimal placement of racks for the service request. In general, a lane is created to allow a rack to be serviced. For example, the MAID system has access paths around one or more sides of the perimeter of the racks. A lane is created by creating a plenum space from the access path to the rack requiring service.

In decision 306, MAID control program 104 determines whether the request can be satisfied. In some embodiments, storage devices within the racks need to be powered down before they can be moved. In these embodiments, a request cannot be satisfied where a storage device is in use. For example, a user may be accessing data on a storage device within a rack and powering down the storage device would disrupt the access to the information. If MAID control program 104 determines that the request can be satisfied (decision 306, YES branch), then MAID control program 104 moves racks to create a service lane (step 314). If MAID control program 104 determines that the request cannot be satisfied (decision 306, NO branch), then MAID control program 104 determines whether the request is an emergency (decision 308).

In decision 308, MAID control program 104 determines whether the request is an emergency. In some cases, service to a rack may be a higher priority than a user's access to information stored on a storage device in the rack. For example, damage to a rack may prevent the rack from moving on the tracks within the MAID system. In another example, damage to a storage device within the rack can prevent retrieval of required data. If MAID control program 104 determines that the request is an emergency (decision 308, YES branch), then MAID control program 104 calculates the minimum number of storage devices to power down (step 310). If MAID control program 104 determines that the request is not an emergency (decision 308, NO branch), then a constraint is added to the next scheduled move to permit the maintenance (step 318).

In step 310, MAID control program 104 calculates the minimum number of storage devices that need to be powered down to complete the service request. In some embodiments, powering down a storage device can affect a user's access to information. To minimize user interruptions, MAID control program 104 determines a rack configuration that affects the least number of powered-up storage devices. In some embodiments, user access to a storage device in one rack may take precedence over user access to other storage devices. In these embodiments, MAID control program 104 may determine a rack configuration which requires more storage devices to be powered down, allowing the user to maintain access to the needed information. Based on the calculations, MAID control program 104 determines a rack configuration. In step 312, MAID control program 104 powers down the affected storage devices, based on the rack configuration.

In step 314, MAID control program 104 moves racks based on the rack configuration. MAID control program 104 sends directions to controller 112 to move one or more racks within the MAID system. In some embodiments, the racks are on wheels which move one-dimensionally along a track. In embodiment where moving racks includes modifying air flow through vents, the air flow may be modified. For example, air flow to vents located near the service lane can be shut off.

In step 316, MAID control program 104 powers up storage devices. In some embodiments, storage devices in racks unaffected by the maintenance can be powered on to provide a user to access information located on the storage devices. In other embodiments, the storage devices in the racks are not powered up until the maintenance is finished. In these embodiments, one or more racks can be moved before the storage devices are powered up.

In step 318, MAID control program 104 adds a constraint to the next scheduled move. Where a service request is made that affects powered-up storage devices, but is not an emergency, the request is delayed. A constraint is added to the next scheduled move, allowing a rack to be serviced without disrupting a user's access to information on a storage device.

Figure 4A:
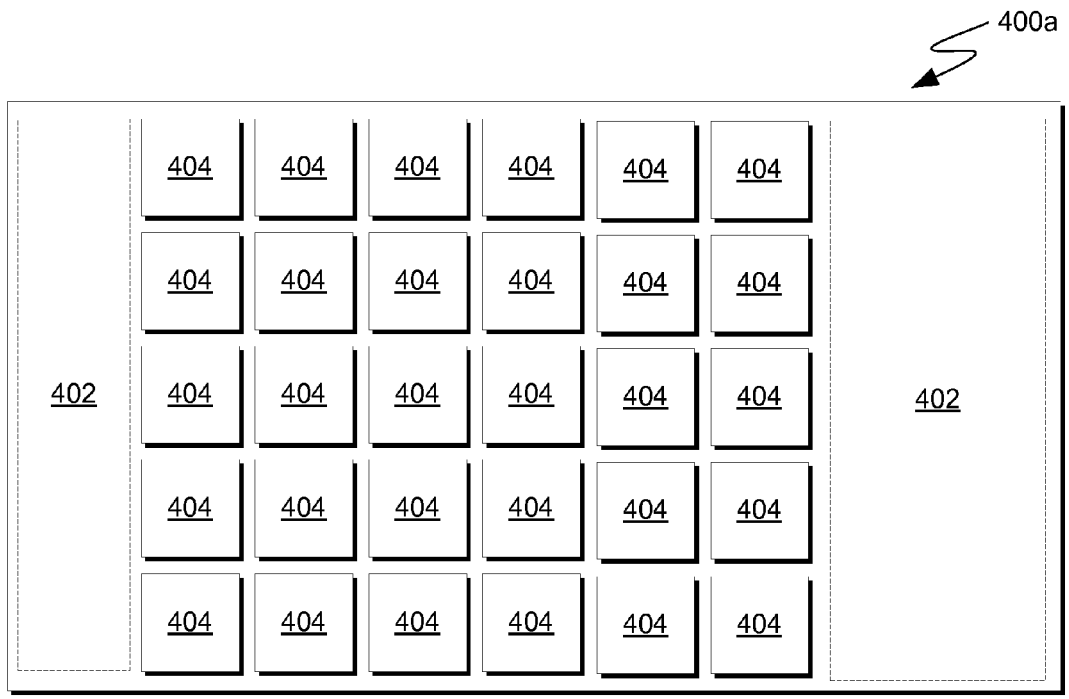
FIG. 4a is a block diagram of a top view of components of a MAID system, in accordance with an embodiment of the present invention.

FIG. 4a is a block diagram of a top view of components of a MAID system, generally designated 400a, in accordance with an embodiment of the present invention. In one embodiment, MAID system 400a is representative of a system controlled by MAID control program 104. For example, FIG. 4a is a block diagram of racks controlled by executing operation of MAID control program 104.

MAID system 400a is representative of a system where all storage devices in racks 404 are powered down. For example, MAID system 400a represents a system where there is not a need to cool any of the storage devices. MAID system 400a includes racks 404 and plenum space 402. Each rack 404 includes one or more storage devices. In some embodiments, the storage devices are stored in a powered down or standby state. In these embodiments, racks 404 require less air flow to maintain a cool temperature, allowing racks 404 to be stored close to each other. In some embodiments, when storage devices within racks 404 are in the powered down state, plenum spaces 402 are located on the exterior, or perimeter, of MAID system 400a. In other embodiments, plenum spaces 402 are located throughout MAID system 400a. For example, plenum space 402 can be arranged in a way that creates sections of racks 404, where plenum space 402 creates an access lane between the sections. In some embodiments, racks 404 are placed on wheels, allowing racks 404 to move. In some embodiments, rails are placed throughout MAID system 400a, which act as tracks for racks 404 to move along. For example, the rails are attached to the floor or ceiling of MAID system 400a and allow racks 404 to move one-dimensionally (e.g., to the left or right). Racks 404 can be moved into plenum spaces 402. In some embodiments, racks 404 are moved to create a plenum space 402 next to a rack that needs to be cooled.

In addition to creating plenum spaces, an embodiment of the invention includes vents (e.g., in the floor or the ceiling of MAID system 400a) that provide air flow to racks 404. In one embodiment, the vents include baffles that can be directed toward a rack to provide additional cooling. For example, MAID control program 104 issues instructions to controller 112, which moves the baffles to modify the direction of the airflow. In some embodiments, MAID system 400a includes an air handler controller that can open and close the baffles to direct and control the air flow.

Figure 4B:
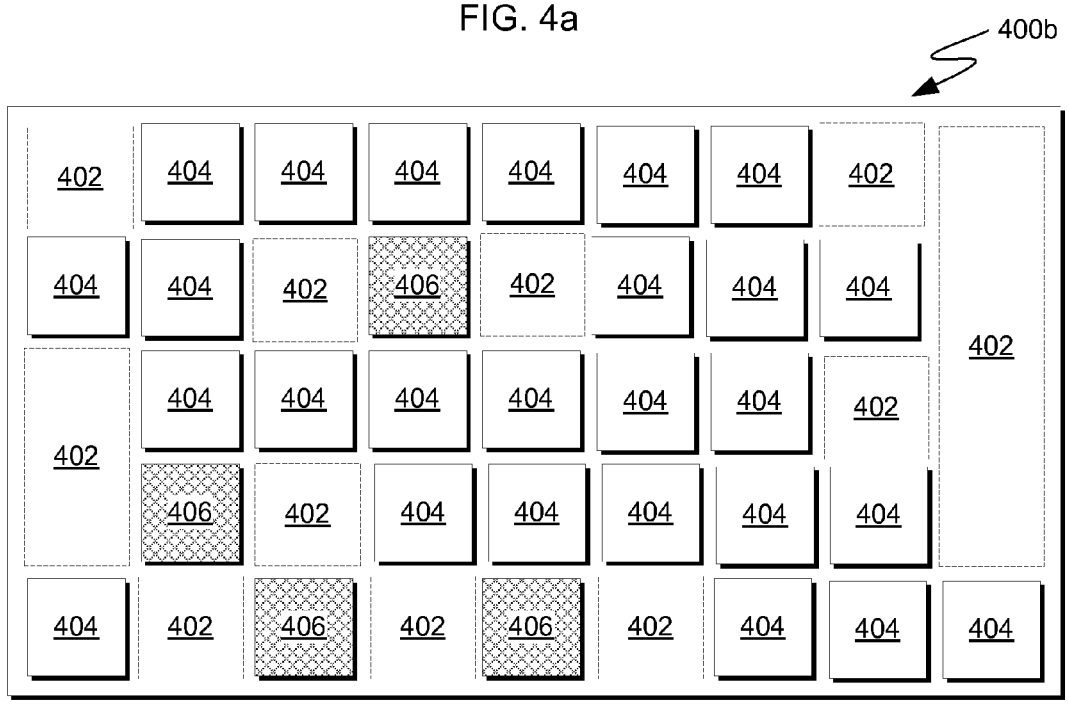
FIG. 4b is a block diagram of a top view of components of a MAID system, in accordance with an embodiment of the present invention.

FIG. 4b is a block diagram of a top view of components of a MAID system, generally designated 400b, in accordance with an embodiment of the present invention. In one embodiment, MAID system 400b is representative of a system controlled by MAID control program 104. For example, FIG. 4*b* is a block diagram of racks controlled by executing operation of MAID control program 104.

MAID system 400*b* is exemplary of a system that has several hot racks 406. MAID system 400*b* also include racks 404 and plenum spaces 402. In this example, racks 404 have been moved along rails within the system to create plenum spaces 402 around hot racks 406.

Figure 5:
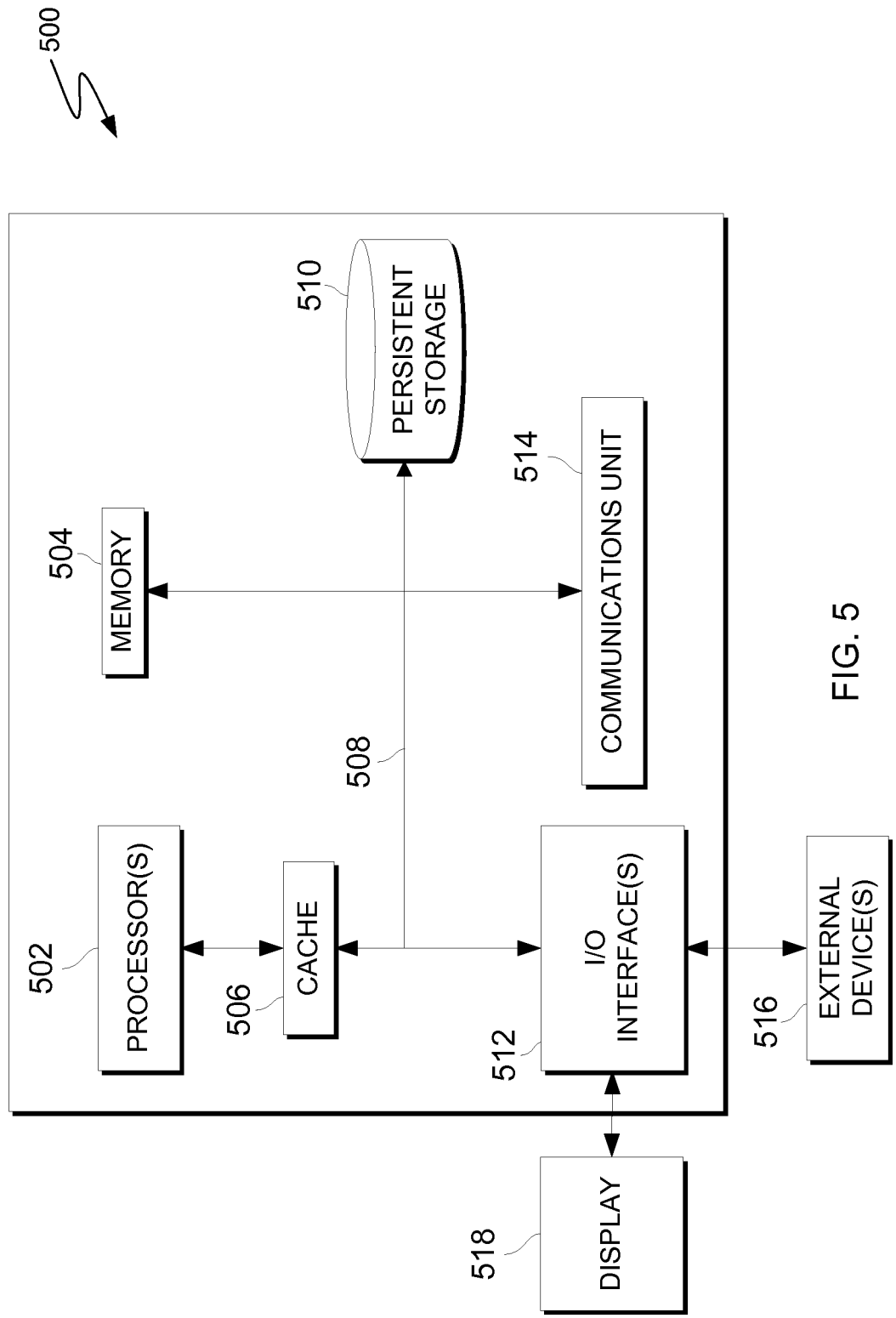
FIG. 5 is a block diagram of components of a computing device executing operations for creating plenum spaces between racks in a MAID system, in accordance with an embodiment of the present invention.

FIG. 5 is a block diagram of components of a computing device, generally designated 500, in accordance with an embodiment of the present invention. In one embodiment, computing device 500 is representative of computing device 102. For example, FIG. 5 is a block diagram of computing device 102 within computing environment 100 executing operations of MAID control program 104.

It should be appreciated that FIG. 5 provides only an illustration of one implementation and does not imply any limitations with regard to the environments in which different embodiments may be implemented. Many modifications to the depicted environment may be made.

Computing device 500 includes communications fabric 508, which provides communications between computer processor(s) 502, memory 504, cache 506, persistent storage 510, communications unit 514, and input/output (I/O) interface(s) 512. Communications fabric 508 can be implemented with any architecture designed for passing data and/or control information between processors (such as microprocessors, communications and network processors, etc.), system memory, peripheral devices, and any other hardware components within a system. For example, communications fabric 508 can be implemented with one or more buses.

Memory 504 and persistent storage 510 are computer-readable storage media. In this embodiment, memory 504 includes random access memory (RAM). In general, memory 504 can include any suitable volatile or non-volatile computer readable storage media. Cache 506 is a fast memory that enhances the performance of processors 502 by holding recently accessed data, and data near recently accessed data, from memory 504.

Program instructions and data used to practice embodiments of the present invention may be stored in persistent storage 510 and in memory 504 for execution by one or more of the respective processors 502 via cache 506. In an embodiment, persistent storage 510 includes a magnetic hard disk drive. Alternatively, or in addition to a magnetic hard disk drive, persistent storage 510 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 510 may also be removable. For example, a removable hard drive may be used for persistent storage 510. Other examples include optical and magnetic disks, thumb drives, and smart cards that are inserted into a drive for transfer onto another computer-readable storage medium that is also part of persistent storage 510.

Communications unit 514, in these examples, provides for communications with other data processing systems or devices, including resources of network 120. In these examples, communications unit 514 includes one or more network interface cards. Communications unit 514 may provide communications through the use of either or both physical and wireless communications links. Program instructions and data used to practice embodiments of the present invention may be downloaded to persistent storage 510 through communications unit 514.

I/O interface(s) 512 allows for input and output of data with other devices that may be connected to computing device 500. For example, I/O interface 512 may provide a connection to external devices 516 such as a keyboard, keypad, a touch screen, and/or some other suitable input device. External devices 516 can also include portable computer-readable storage media such as, for example, thumb drives, portable optical or magnetic disks, and memory cards. Software and data used to practice embodiments of the present invention (e.g., software and data) can be stored on such portable computer-readable storage media and can be loaded onto persistent storage 510 via I/O interface(s) 512. I/O interface(s) 512 also connect to a display 518.

Display 518 provides a mechanism to display data to a user and may be, for example, a computer monitor, or a television screen.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    identifying, by one or more processors, a first rack in a data center corresponding to a request, wherein the data center comprises a plurality of racks, and wherein the request is selected from the group consisting of:
        a request to change a power status of a storage device of the first rack; and
        a request to service the first rack;
    determining, by one or more processors, that the request includes a request for service of the first rack, wherein the request for service includes a request for a service lane;
    calculating, by one or more processors, a minimum number of racks to be powered down to create the service lane;
    calculating, by one or more processors, an optimal placement for the plurality of racks to satisfy a condition of the request; and
    moving, by one or more processors, one or more racks from a first location to a second location, based on the calculated optimal placement of the one or more racks.

2. The method of claim 1, wherein each of the one or more racks is capable of one-dimensional movement.

3. The method of claim 2, wherein the one-dimensional movement of the one or more racks comprises a rack movably positioned by a plurality of wheels, and the plurality of wheels guided along one or more rails within the data center.

4. The method of claim 1, wherein a condition of the request is a cooling condition and calculating the optimal placement for the plurality of racks further comprises:
    determining, by one or more processors, an optimal air flow for the cooling condition of the first rack, wherein the data center comprises one or more air vents, and wherein an air flow through the one or more air vents is variable; and
    modifying, by one or more processors, the air flow to the first rack by modifying the air flow of one or more air vents to satisfy the cooling condition of the request.

5. The method of claim 1, wherein the optimal placement of the one or more racks positions the first rack away from at least one adjacent rack such that the first rack and the at least one adjacent rack define at least one plenum space.

6. The method of claim 1, wherein each rack of the plurality of racks is a computer rack capable of holding at least one computing device, storage device, or networking device.

7. A computer program product, the computer program product comprising:
a computer readable storage medium and program instructions stored on the computer readable storage medium, the program instructions comprising:
program instructions to identify a first rack in a data center corresponding to a request, wherein the data center comprises a plurality of racks, and wherein the request is selected from the group consisting of:
a request to change a power status of a storage device of the first rack; and
a request to service the first rack;
program instructions to determine that the request includes a request for service of the first rack, wherein the request for service includes a request for a service lane;
program instructions to calculate a minimum number of racks to be powered down to create the service lane;
program instructions to calculate an optimal placement for the plurality of racks to satisfy a condition of the request; and
program instructions to move one or more racks from a first location to a second location, based on the calculated optimal placement of the one or more racks.

8. The computer program product of claim 7, wherein each of the one or more racks is capable of one-dimensional movement.

9. The computer program product of claim 8, wherein the one-dimensional movement of the one or more racks comprises a rack movably positioned by a plurality of wheels, and the plurality of wheels guided along one or more rails within the data center.

10. The computer program product of claim 7, wherein a condition of the request is a cooling condition and program instructions to calculate the optimal placement for the plurality of racks further comprises:
program instructions to determine an optimal air flow for the cooling condition of the first rack, wherein the data center comprises one or more air vents, and wherein an air flow through the one or more air vents is variable; and
program instructions to modify the air flow to the first rack by modifying the air flow of one or more air vents to satisfy the cooling condition of the request.

11. The computer program product of claim 7, wherein the optimal placement of the one or more racks positions the first rack away from at least one adjacent rack such that the first rack and the at least one adjacent rack define at least one plenum space.

12. The computer program product of claim 7, wherein each rack of the plurality of racks is a computer rack capable of holding at least one computing device, storage device, or networking device.

13. A computer system, the computer system comprising:
one or more computer processors;
one or more computer readable storage media;
program instructions stored on the computer readable storage media for execution by at least one of the one or more processors, the program instructions comprising:
program instructions to identify a first rack in a data center corresponding to a request, wherein the data center comprises a plurality of racks, and wherein the request is selected from the group consisting of:
a request to change a power status of a storage device of the first rack; and
a request to service the first rack;
program instructions to determine that the request includes a request for service of the first rack, wherein the request for service includes a request for a service lane;
program instructions to calculate a minimum number of racks to be powered down to create the service lane;
program instructions to calculate an optimal placement for the plurality of racks to satisfy a condition of the request; and
program instructions to cause a controller to automatically move one or more racks from a first location within the data center to a second location within the data center, based on the calculated optimal placement of the one or more racks.

14. The computer system of claim 13, wherein each of the one or more racks is capable of one-dimensional movement, and wherein each rack of the plurality of racks is a computer rack capable of holding at least one computing device, storage device, or networking device.

15. The computer system of claim 14, wherein the one-dimensional movement of the one or more racks comprises a rack movably positioned by a plurality of wheels, and the plurality of wheels guided along one or more rails within the data center.

16. The computer system of claim 13, wherein a condition of the request is a cooling condition and program instructions to calculate the optimal placement for the plurality of racks further comprises:
program instructions to determine an optimal air flow for the cooling condition of the first rack, wherein the data center comprises one or more air vents, and wherein an air flow through the one or more air vents is variable; and
program instructions to modify the air flow to the first rack by modifying the air flow of one or more air vents to satisfy the cooling condition of the request.

17. The computer system of claim 13, wherein the optimal placement of the one or more racks positions the first rack away from at least one adjacent rack such that the first rack and the at least one adjacent rack define at least one plenum space.

* * * * *